United States Patent [19]
Contreras et al.

[11] Patent Number: 5,416,437
[45] Date of Patent: May 16, 1995

[54] DUAL MODE CHARGE PUMP FOR AUTOMATIC GAIN CONTROL CIRCUITS

[75] Inventors: Richard Contreras, Laguna Beach; Tim Jackson, Yorba Linda, both of Calif.

[73] Assignee: Silicon Systems, Inc., Tustin, Calif.

[21] Appl. No.: 312,497

[22] Filed: Sep. 26, 1994

Related U.S. Application Data

[63] Continuation of Ser. No. 12,324, Feb. 2, 1993, abandoned.

[51] Int. Cl.$^6$ .......................... H03K 17/16; G05F 1/10
[52] U.S. Cl. ..................................... 327/536; 327/333; 327/390
[58] Field of Search ................. 307/578, 264, 607, 482; 327/536, 390, 333

[56] References Cited

U.S. PATENT DOCUMENTS 5,202,587 4/1993 McLaury ............................. 307/264
5,214,316 5/1993 Nagai ................................... 307/264

Primary Examiner—Margaret Rose Wambach
Attorney, Agent, or Firm—Hecker & Harriman

[57] ABSTRACT

A dual mode charge pump for an AGC circuit is described. The charge pump of the present invention provides normal and accelerated rates of charge and discharge of a capacitor used to control the gain of an AGC amplifier. Current sources for providing accelerated charge and discharge rates are deselected when not needed. Since these current sources consume substantial amounts of power, deselecting them increases efficiency and reduces unnecessary power consumption. The current sources may be deselected internally or may be switched off by a switches in series with the current sources. The present invention also may be used to provide a self-timing function. The self-timing function allows the AGC to acquire the correct gain in an optimum time after initiation by an external control signal.

19 Claims, 4 Drawing Sheets

DUAL MODE CHARGE PUMP FOR AUTOMATIC GAIN CONTROL CIRCUITS

This is a continuation of application Ser. No. 08/012,324 filed Feb. 2, 1993, now abandoned.

BACKGROUND OF THE INVENTION

1. Field of the Invention

The present invention relates to charge pump circuits generally, and particularly to charge pump circuits for automatic gain control (AGC) circuits.

2. Background Art

AGC circuits are used to provide an output of relatively constant amplitude from an input of varying amplitude. AGCs provide a relatively constant output by providing a gain inversely proportional to the input amplitude. Thus, if the input amplitude is decreased, the AGC provides increased gain to maintain constant output amplitude. If the input amplitude is increased, the AGC provides decreased gain to main constant output amplitude.

AGCs are useful for many applications. One example involves the reading of data from a disk drive. Information on a disk drive may have been recorded at different recording levels or variations may exist across the media. As a result, signals read from a disk drive may differ in amplitude. To ensure proper reading of signals of different amplitude, an AGC may be used to adjust the signal to a desired amplitude.

An AGC must be relatively insensitive to spikes or transient variations in the incoming signal. Thus, AGCs are often designed to adjust amplifier gain gradually or incrementally, rather than instantaneously. By responding to changes in the input signal gradually, spurious signals can be ignored.

To avoid saturating the amplifier or associated circuitry, an AGC must maintain amplifier gain in a range that keeps the output below an excessive level. Saturation must be avoided because it results in distortion of the signal and can reduce the accuracy of data derived from the signal. It is often desirable to have an AGC increase amplifier gain at a different rate than it decreases amplifier gain. For example, an AGC is often designed to decrease gain more quickly than it increases gain. Thus, if the input signal changes from high amplitude to low amplitude, gain is increased gradually to maximize immunity to transients and to avoid overshooting the desired gain and saturating the amplifier. However, if the input signal changes from low amplitude to high amplitude, gain is decreased more rapidly to keep the amplifier output below the level of saturation.

It is desirable to have an AGC circuit maintain a fairly constant peak to peak level of a signal rather than a constant average level. If an AGC circuit maintained a constant average level, signals having a large dynamic range could be amplified excessively, leading to saturation of signal processing components. A signal having a large dynamic range varies greatly in amplitude, being at a low amplitude some of the time, but also reaching high peak amplitudes. By normalizing the peak to peak level rather than the average level, the gain is adjusted to maximize amplitude without causing amplitude peaks to saturate the signal processing circuitry.

To normalize the peak to peak amplitude of the signal, it is desirable to provide a faster rate of gain decrease than the rate of gain increase. Peaks occurring in the signal cause the AGC circuit to reduce gain, while low amplitude portions of the signal cause the AGC circuit to increase gain. Thus, to follow peaks, an AGC circuit should be more responsive to peaks (by decreasing gain rapidly) than to low amplitude portions.

A typical AGC circuit includes a charge pump, a capacitor and a voltage controlled amplifier. The voltage controlled amplifier receives an input signal, amplifies it by an amount determined by a control voltage input and produces an amplified output. The amplified output is used to control the charge pump. The charge pump is coupled to the capacitor and moves charge into and out of the capacitor, thus changing the voltage across the capacitor. The capacitor is coupled to the control voltage input of the voltage controlled amplifier. As the voltage across the capacitor changes, the control voltage input of the voltage controlled amplifier changes, resulting in a change in the gain of the voltage controlled amplifier. Thus, a change in the signal at the input of the charge pump can change the gain of the voltage controlled amplifier. Since the input of the charge pump is controlled by the output of the voltage controlled amplifier, a loop is formed where a change in the output of the amplifier can result in a change in gain of the amplifier.

An AGC circuit is typically used to maintain a signal within a limited amplitude range. When the amplitude at the output of the voltage controlled amplifier exceeds the upper limit of the desired range, the charge pump moves charge into or out of the capacitor to change the voltage of the control input of the voltage controlled amplifier and reduce its gain. By reducing the amplifier gain, the amplitude of the output of the voltage controlled amplifier will be reduced until it is within the desired range. When the amplitude at the output of the voltage controlled amplifier falls below the lower limit of the desired range, the charge pump moves charge out of or into the capacitor to change the voltage of the control input of the voltage controlled amplifier and increase its gain. By increasing the amplifier gain, the amplitude of the output of the voltage controlled amplifier will be increased until it is within the desired range.

FIG. 4 illustrates an AGC circuit. The AGC circuit includes voltage sources VPG, vin and VRC; AGC amplifier AGCA; AGC amplifier control block AGCB; charge pump CHP; filter FILTER; full wave rectifier FWR; digital-to-analog converter AGCDAC; buffers ABUFF, CBUFF and DBUFF; capacitors Cbyp, CIA, CIA*, COA, COA*, COD, COD*, CON and CON* and outputs LEVEL, AGCLVL, COUT and DOUT.

The first terminal of voltage source vin is coupled to the first terminal of capacitor CIA*. The second terminal of capacitor CIA* is coupled to node VIA*, which is coupled to the first input of AGC amplifier AGCA. The second terminal of voltage source vin is coupled to the first terminal of capacitor CIA. The second terminal of capacitor CIA is coupled to node VIA, which is coupled to the second input of AGC amplifier AGCA. The first output of AGC amplifier AGCA is coupled to node VOA*, which is coupled to the first terminal of capacitor COA*. The second terminal of capacitor COA* is coupled to node IN*, which is coupled to the first input of filter FILTER. The second output of AGC amplifier AGCA is coupled to node VOA, which is coupled to the first terminal of capacitor COA. The second terminal of capacitor COA is coupled to node IN, which is coupled to the second input of filter FILTER.

The first output of filter FILTER is coupled to node OD, which is coupled to the first terminal of capacitor COD. The second terminal of capacitor COD is coupled to node CP, which is coupled to the first input of buffer CBUFF. The second output of filter FILTER is coupled to node OD*, which is coupled to the first terminal of capacitor COD*. The second terminal of capacitor COD* is coupled to node CN, which is coupled to the second input of buffer CBUFF. The output of buffer CBUFF is coupled to output COUT. The third output of filter FILTER is coupled to node ON, which is coupled to the first terminal of capacitor CON. The second terminal of capacitor CON is coupled to node DP, which is coupled to the first input of buffer DBUFF and to the first input of full wave rectifier FWR. The fourth output of filter FILTER is coupled to node ON*, which is coupled to the first terminal of capacitor CON*. The second terminal of capacitor CON* is coupled to node DN, which is coupled to the second input of buffer DBUFF and to the second input of full wave rectifier FWR. The output of buffer DBUFF is coupled to output DOUT.

Voltage source VPG is coupled to the positive terminal of voltage source VRC and to the first terminal of capacitor Cbyp. The negative terminal of voltage source VRC is coupled to digital-to-analog converter AGCDAC, full wave rectifier FWR, AGC amplifier control block AGCB and charge pump CHP. An output of digital-to-analog converter AGCDAC is coupled to node AGC_DAC, which is coupled to charge pump CHP and to output AGCLVL. An output of full wave rectifier FWR is coupled to node FWR_OUT, which is coupled to charge pump CHP and to the input of buffer ABUFF. The output of buffer ABUFF is coupled to output LEVEL. An output of charge pump CHP is coupled to node AGCOUT, which is coupled to the second terminal of capacitor Cbyp and to AGC amplifier control block AGCB. An output of AGC amplifier control block AGCB is coupled to a control input of AGC amplifier AGCA.

An AC input signal is provided by voltage source vin and is coupled to AGC amplifier AGCA at nodes VIA and VIA* through capacitors CIA and CIA*. After amplification of the signal at the appropriate amount of gain by AGC amplifier AGCA, the signal is output to nodes VOA and VOA* and coupled to nodes IN and IN* through capacitors COA and COA* into filter FILTER. Filter FILTER performs the desired filtering of the signal. The filtering may include whatever signal processing is appropriate for the intended application. The output of filter FILTER is provided to nodes 0D and OD* and coupled to nodes CP and CN through capacitors COD and COD* and into buffer CBUFF. Buffer CBUFF buffers the signal and provides output COUT. The output of filter FILTER is also provided to nodes ON and ON* and coupled via capacitors CON and CON* to nodes DP and DN and into buffer DBUFF, as well as into full wave rectifier FWR. Buffer DBUFF buffers the signal and provides output DOUT.

Full wave rectifier FWR rectifies the AC signal received from nodes DP and DN and provides an output at node FWR_OUT, which is supplied to buffer ABUFF and to charge pump CHP. The output of buffer ABUFF is available at output LEVEL. The output of AGCDAC appears at node AGC_DAC, is available at output AGCLVL and is supplied to charge pump CHP.

Charge pump CHP compares the output of full wave rectifier FWR at node FWR_OUT to the output of digital-to-analog converter AGCDAC at node AGC_DAC. Charge pump CHP pumps charge into or one of capacitor Cbyp at node AGCOUT in response to changes in the relationship between FWR_OUT and AGC_DAC. If the potential at node FWR_OUT exceeds the potential at node AGC_DAC, charge pump CHP pulls charge from capacitor Cbyp, causing AGC amplifier control block AGCB to lower the gain of AGC amplifier AGCA. If the potential at node FWR_OUT is less than the potential at node AGC_DAC, charge pump CHP pushes charge into capacitor Cbyp, causing AGC amplifier control block AGCB to raise the gain of AGC amplifier AGCA. Alternatively, the charge pump may push charge instead of pulling charge to lower the AGC gain and pull charge instead of pushing charge to raise the AGC gain. Regardless of the relative relationships of capacitor charge to AGC gain, an in balance between node AGC_DAC and node FWR_OUT causes charge pump CHP to alter the charge on capacitor Cbyp, causing AGC amplifier AGCA to adjust its gain.

AGCs are sometimes designed to allow multiple rates of gain increase and multiple rates of gain decrease. If an input signal increases only gradually and does not threaten to result in amplifier saturation, the AGC may decrease gain gradually without risk of saturation. However, if the input signal rapidly increases to a level that would result in saturation, the AGC decreases gain more rapidly to avoid saturation. If the input signal decreases in amplitude, the risk of saturation is not present, so gain may be increased gradually. However, at certain planned transitions, such as power up or switching between data and servo mode, the need for a rapid increase in gain may be anticipated and a means for providing a rapid increase in gain may be desired. Thus, AGC circuits often provide for accelerated gain increase on command. An input is provided to allow a microprocessor or some other device to select accelerated gain increase when desired.

FIG. 1 illustrates a prior art circuit for providing different rates of increase and decrease of gain for an AGC. The prior art circuit includes voltage sources VPG and VRC; current sources I1, I2, I3 and I4; transistors Q1, Q2, Q3 and Q4; resistors R1 and R2; switch S1; inputs FDC, AGC_DAC and FWR_OUT; output AGCOUT and ground potential gnd. The negative terminal of voltage source VPG is coupled to ground potential gnd. The positive terminal of voltage source VPG is coupled to the positive terminal of voltage source VRC, to the collector of transistor Q1, to the collector of transistor Q3, to the first terminal of each of current sources I1 and I2. Input AGC_DAC is coupled to the first terminal of resistor R2 and to the base of transistor Q3. The second terminal of resistor R2 is coupled to the first terminal of resistor R1 and to the base of transistor Q1. The second terminal of resistor R1 is coupled to the negative terminal of voltage source VRC. The emitter of transistor Q1 is coupled to the emitter of transistor Q2 and to the first terminal of current source I3. Input FWR_OUT is coupled to the base of each of transistors Q2 and Q4. The second terminal of current source I2 is coupled to the first terminal of switch S1. The second terminal of switch S1 is coupled to the output AGCOUT, to the second terminal of current source I1 and to the collector of each of transistors Q2 and Q4. Input FDC is coupled to the third terminal, which is a control terminal, of switch S1. The emitter of transistor Q3 is coupled to the emitter of transistor Q4 and to the first terminal of current source I4. The second terminal of each of current sources I3 and I4 is coupled to ground potential gnd.

Voltage source VPG serves as the power supply for the circuit. Voltage source VRC provides a reference voltage. Resistors R1 and R2 form a voltage divider that places the base of Q1 at a voltage given by the following equation:

$$V_{BQ1} = \left(\frac{R_1}{R_1 + R_2}(AGC\_DAC - (VPG - VRC))\right) + (VPG - VRC)$$

Transistors Q1 and Q2 form a common emitter differential pair that compares input FWR_OUT to the output of the voltage divider formed by resistors R1 and R2. Current source I3 is also part of the differential amplifier circuit of Q1 and Q2. The output of the Q1/Q2 pair is applied to output AGCOUT. Transistors Q3 and Q4 form a common emitter differential pair that compares the input FWR_OUT to the input AGC_DAC. Current source I4 is also part of the differential amplifier circuit of Q3 and Q4. The output of the Q3/Q4 pair is applied to output AGCOUT.

Current sources I3 and I4 supply current that is controlled by transistor pairs Q1/Q2 and Q3/Q4 to provide output AGCOUT. Current source I2 is switchably coupled to output AGCOUT to allow selection of current flow into output AGCOUT. Input FDC is used to control the selection of current source I2. When a low charging rate is desired from the charge pump, current source I1 is coupled to output AGCOUT and current source I2 is deselected. When a high charging rate is desired from the charge pump, both current sources I1 and I2 are coupled to output AGCOUT.

The differential pair of Q1 and Q2 provides a lower discharging current through relatively lower current source I3, while the differential pair of Q3 and Q4 provides a higher discharging current through relatively higher current source I4. Under normal operation, the circuit rarely operates in the higher discharge current mode. Thus, current source I4 is rarely needed. However, in this prior art circuit, current source I4 draws power even when not needed. When needed, current source I4 provides current flow through the collector of transistor Q4. When the higher discharge current is not desired, current source I4 is diverted through the collector of transistor Q3. Since current source I4 provides a relatively high current, maintaining this current when it is not needed results in an unnecessarily high quiescent current drain. High current drain is incompatible with battery-operated devices, such as laptop, notebook, or other small computers, which often have elaborate power management systems to maximize power conservation. Thus, a charge pump that minimizes current drain is desired.

SUMMARY OF THE INVENTION

The present invention provides a dual mode charge pump for AGCs that minimizes power consumption. The present invention deselects a switchably coupled current source when it is not required. Deselecting the current source and eliminating its power consumption significantly reduces the power consumption of the circuit as a whole. Thus, a charge pump is provided that is compatible with low power systems.

The present invention senses when a high discharge current is required and couples a current source to the charge pump output to provide increased current when necessary. When the current source is not needed, the current source is decoupled from the output. The current source may be intrinsically switchable or a separate switch may be used with an nonswitchable current source.

In the preferred embodiment of the present invention, a comparator is used to sense when an additional parallel current source should be selected. The comparator provides an output that closes a switch to couple an additional current source to the charge pump output. The comparator eliminates the need for the inefficient second differential pair of the prior art.

The switch controlled by the output of the comparator may be part of the current source itself or may be separate from the current source. If a field effect transistor (FET) is used as the current source, it may also be used as a switch simply by applying or removing the bias voltage from its gate. Thus, the gate may be used both to control the current and to switch the current source on and off. Alternatively, a switch may be provided in series with a current source to allow selection and deselection of the current source. A FET or any other suitable switching device may used as the switch, and any suitable current source may be used as the current source.

The preferred embodiment of the present invention is useful for controlling the gain of an AGC circuit. The input signal is compared to a reference signal. If the input signal is greater that the reference signal, the circuit decreases the AGC gain. If the input signal is much greater than the reference signal, an additional current source is selected to allow rapid decrease of gain. If the input signal is less than the reference signal, the circuit increases gain. If it is predicted that the input signal will be much less than the reference signal, an external circuit can select the additional current source to increase current rapidly.

Thus, a charge pump for AGCs has been provided that minimizes power consumption.

DETAILED DESCRIPTION OF THE INVENTION

A dual mode charge pump for an AGC circuit is described. In the following description, numerous specific details are set forth in order to provide a more thorough understanding of the present invention. It will be apparent, however, to one skilled in the art, that the present invention may be practiced without these specific details. In other instances, well-known features have not been described in detail in order not to unnecessarily obscure the present invention.

Prior art charge pumps for AGCs consume more power than necessary. Current sources which are needed only rarely have been implemented in a manner that results in unnecessary power consumption. At the same time, many devices that were formerly powered from AC mains wiring have been miniaturized and made more efficient to allow battery powered operation. Inefficient charge pumps for AGCs reduce the efficiency of such battery powered devices and shorten battery life or discharge time. Therefore, there is a need for a charge pump for AGCs that maximizes efficiency and power conservation.

The present invention avoids problems of the prior art by selectively turning off a current source of relatively high current when it is not required. By turning off the current source, substantial unnecessary current drain is eliminated. However, since the current source may be switched back into the circuit whenever needed, the performance of the AGC is not compromised.

The present invention can also provide a self-timing feature to simplify the control requirements for the charge pump. The self-timing feature may be used to automatically limit an externally initiated accelerated charging mode if the externally supplied control signal is not reset at the proper time. The self-timing feature prevents the AGC front departing from the desired gain parameters and allows the proper gain to be rapidly acquired.

Figure 1:
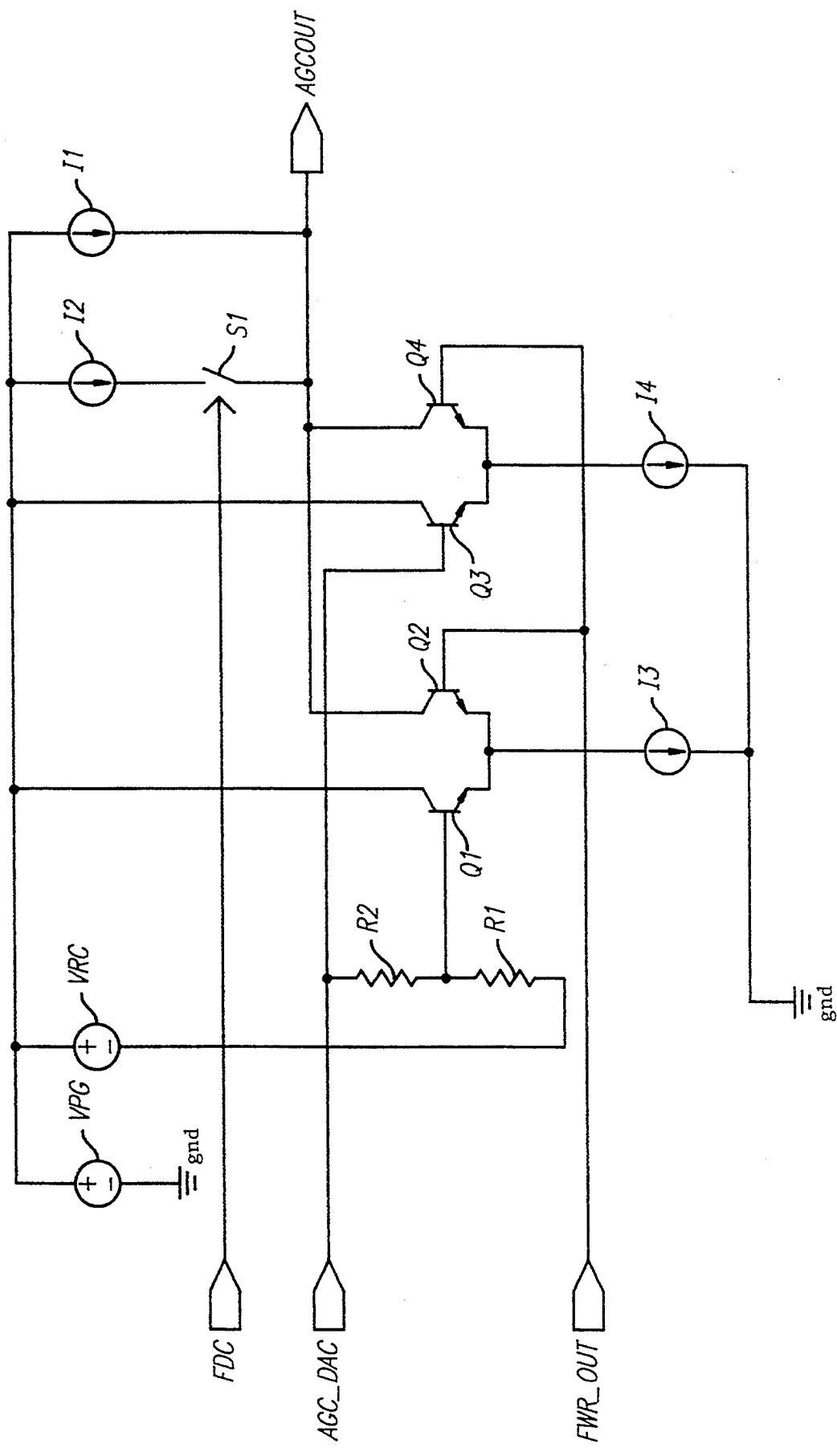
FIG. 1 is a schematic diagram of a prior art charge pump.
Figure 2:
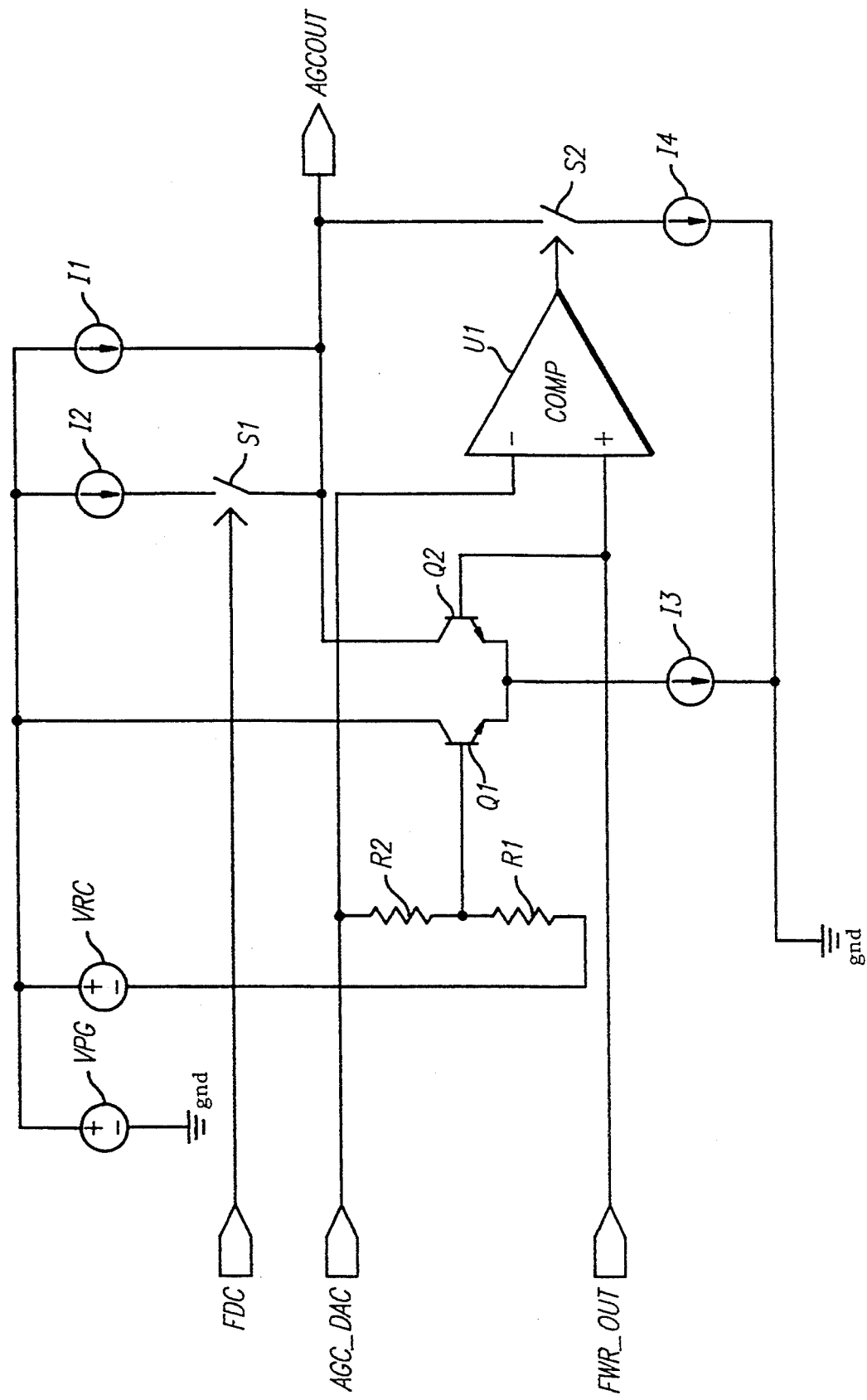
FIG. 2 is a schematic diagram of the charge pump of the preferred embodiment of the present invention.

The preferred embodiment of the present invention is illustrated in FIG. 2. The charge pump of the preferred embodiment includes voltage sources VPG and VRC; current sources I1, I2, I3 and I4; switches S1 and S2; resistors R1 and R2; transistors Q1 and Q2; comparator U1; inputs FDC, AGC_DAC and FWR_OUT; output AGCOUT and ground potential gnd.

The negative terminal of voltage source VPG is coupled to ground potential gnd. The positive terminal of voltage source VPG is coupled to the positive terminal of voltage source VRC, to the collector of transistor Q1, and to the first terminal of each of current sources I1 and I2. Input AGC_DAC is coupled to the first terminal of resistor R2 and to the inverting input of comparator U1. The second terminal of resistor R2 is coupled to the first terminal of resistor R1 and to the base of transistor Q1. The second terminal of resistor R1 is coupled to the negative terminal of voltage source VRC. The emitter of transistor Q1 is coupled to the emitter of transistor Q2 and to the first terminal of current source I3. Input FWR_OUT is coupled to the base of transistor Q2 and to the noninverting input of comparator U1. The second terminal of current source I2 is coupled to the first terminal of switch S1. The second terminal of switch S1 is coupled to the output AGCOUT, to the second terminal of current source I1, to the collector of transistor Q2 and to the the first terminal of switch S2. Input FDC is coupled to the third terminal, which is a control terminal, of switch S1. The output of comparator U1 is coupled to the third terminal, which is a control terminal, of switch S2. The second terminal of switch S2 is coupled to the first terminal of current source I4. The second terminal of each of current sources I3 and I4 is coupled to ground potential gnd.

Voltage source VPG serves as the power supply for the circuit. Voltage source VRC provides a reference voltage. Resistors R1 and R2 form a voltage divider that places the base of Q1 at a voltage given by the following equation:

$$V_{BQ1} = \left( \frac{R_1}{R_1 + R_2} (AGC\_DAC - (VPG - VRC)) \right) +$$

$$(VPG - VRC)$$

Transistors Q1 and Q2 form a common emitter differential pair that compares input FWR_OUT to the output of the voltage divider formed by resistors R1 and R2. Current source I3 is also part of the differential amplifier circuit of Q1 and Q2. The output of tile Q1/Q2 pair is applied to output AGCOUT. Comparator U1 compares tile input FWR_OUT to the input AGC_DAC. Comparator U1 produces an output that controls current source I4 using switch S2. Current source I4 provides additional discharge current when selected by comparator U1 via switch S2.

Current sources I3 and I4 supply current that is controlled by transistor pair Q1/Q2 and comparator U1 to provide output AGCOUT. Current source I2 is switchably coupled to output AGCOUT to allow selection of current flow into output AGCOUT. Input FDC is used to control the selection of current source I2. When a low charging rate is desired from the charge pump, current source I1 is coupled to output AGCOUT and current source I2 is deselected. When a high charging rate is desired from the charge pump, both current sources I1 and I2 are coupled to output AGCOUT.

The differential pair of Q1 and Q2 provides a lower discharging current through relatively lower current source I3, while comparator U1 provides a higher discharging current through relatively higher current source I4. Under normal operation, the circuit rarely operates in the higher discharge current mode. Thus, current source I4 is rarely needed. To avoid unnecessary current drain through current source I4, comparator U1 senses when current source I4 is not needed and opens switch S2, deselecting current source I4. However, when input FWR_OUT exceeds input AGC_DAC, a higher discharge rate is desired, and comparator U1 automatically senses the condition and closes switch S2, thereby coupling current source I4 to output AGCOUT and enhancing the discharge rate.

Figure 3:
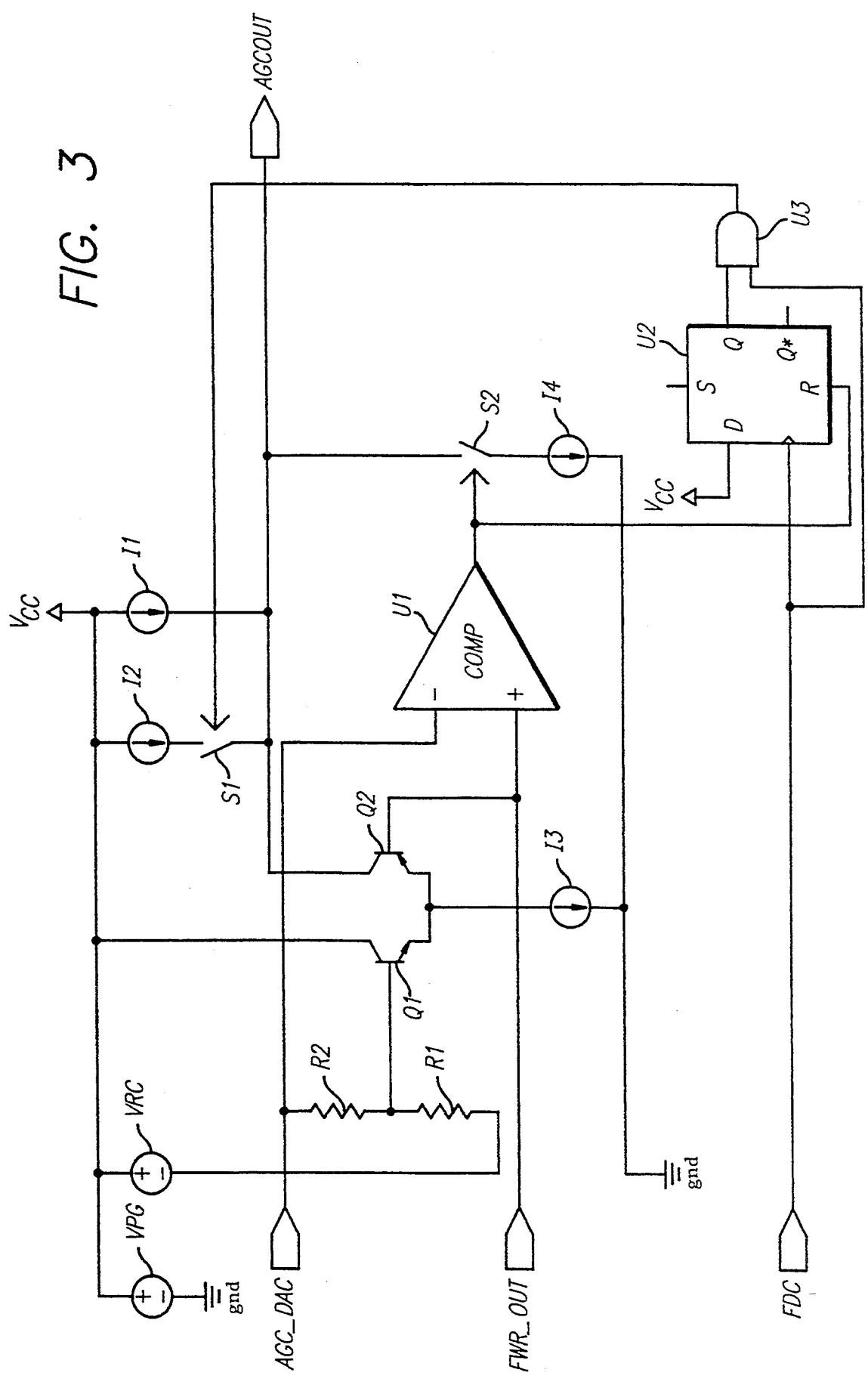
FIG. 3 is a schematic diagram of the charge pump of an alternate embodiment of the present invention.
Figure 4:
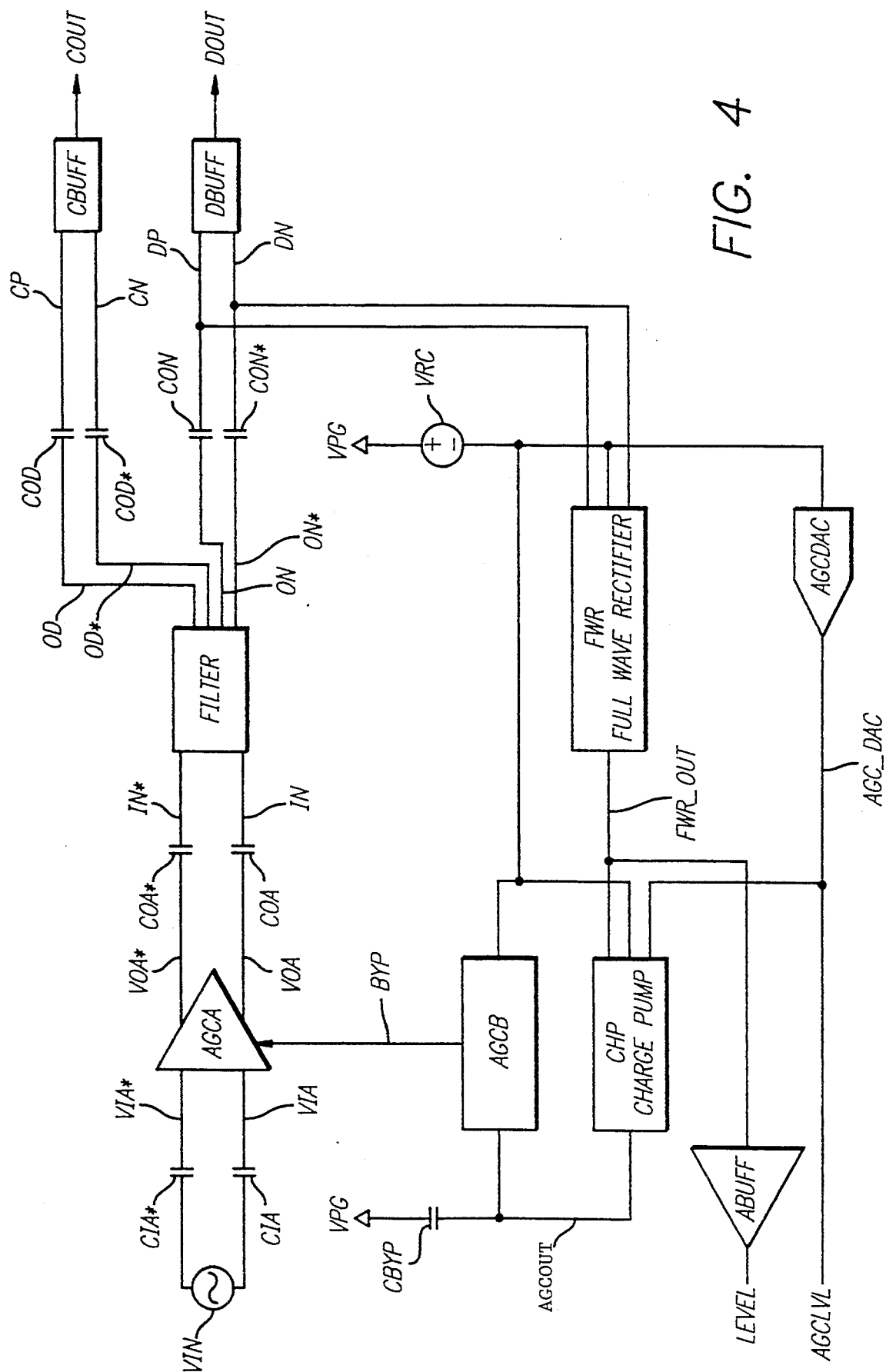
FIG. 4 is a block diagram of an AGC circuit.

An alternate embodiment of the present invention is illustrated in FIG. 3. The charge pump of this alternate embodiment includes voltage sources VPG and VRC; current sources I1, I2, I3 and I4; switches S1 and S2; resistors R1 and R2; transistors Q1 and Q2; comparator U1; flip-flop U2; AND gate U3; inputs FDC, AGC_DAC and FWR_OUT; output AGCOUT; voltage node VCC and ground potential gnd.

The negative terminal of voltage source VPG is coupled to ground potential gnd. The positive terminal of voltage source VPG is coupled to the positive terminal of voltage source VRC, to the collector of transistor Q1, and to the first terminal of each of current sources I1 and I2 and to voltage node VCC. Input AGC_DAC is coupled to the first terminal of resistor R2 and to the inverting input of comparator U1. The second terminal of resistor R2 is coupled to the first terminal of resistor R1 and to the base of transistor Q1. The second terminal of resistor R1 is coupled to the negative terminal of voltage source VRC. The emitter of transistor Q1 is coupled to the emitter of transistor Q2 and to the first terminal of current source I3. Input FWR_OUT is coupled to the base of transistor Q2 and to the noninverting input of comparator U1. The second terminal of current source I2 is coupled to the first terminal of switch S1. The second terminal of switch S1 is coupled to the output AGCOUT, to the second terminal of current source I1, to the collector of transistor Q2 and to the the first terminal of switch S2. The output of comparator U1 is coupled to the reset terminal of flip-flop U2 and to the third terminal, which is a control terminal, of switch S2. The second terminal of switch S2 is coupled to the first terminal of current source I4. The second terminal of each of current sources I3 and I4 is coupled to ground potential gnd. The D input of flip-flop U2 is coupled to voltage node VCC. The Q output of flip-flop U2 is coupled to the first input of AND gate U3. Input FDC is coupled to the clock input of flip-flop U2 and to the second input of AND gate U3. The output of AND gate U3 is coupled to the third terminal, which is a control terminal, of switch S1.

Voltage source VPG serves as the power supply for the circuit. Voltage source VRC provides a reference voltage. Resistors R1 and R2 form a voltage divider that places the base of Q1 at a voltage given by the following equation:

$$V_{BQ1} = \left( \frac{R_1}{R_1 + R_2} (AGC\_DAC - (VPG - VRC)) \right) +$$

$$(VPG - VRC)$$

Transistors Q1 and Q2 form a common emitter differential pair that compares input FWR_OUT to the output of the voltage divider formed by resistors R1 and R2. Current source I3 is also part of the differential amplifier circuit of Q1 and Q2. The output of the Q1/Q2 pair is applied to output AGCOUT. Comparator U1 compares the input FWR_OUT to the input AGC_DAC. Comparator U1 produces an output that controls current source I4 using switch S2. The rising edge of the output of comparator U1 also resets flip-flop U2. Current source I4 provides additional discharge current when selected by comparator U1 via switch S2.

Current sources I3 and I4 supply current that is controlled by transistor pair Q1/Q2 and comparator U1 to provide output AGCOUT. Current source I2 is switchably coupled to output AGCOUT to allow selection of current flow into output AGCOUT. Input FDC is used to control the selection of current source I2. When a low charging rate is desired front the charge pump, current source I1 is coupled to output AGCOUT and current source I2 is deselected. When a high charging rate is desired from the charge pump, both current sources I1 and I2 are coupled to output AGCOUT.

The differential pair of Q1 and Q2 provides a lower discharging current through relatively lower current source I3, while comparator U1 provides a higher discharging current through relatively higher current source I4. Under normal operation, the circuit rarely operates in the higher discharge current mode. Thus, current source I4 is rarely needed. To avoid unnecessary current drain through current source I4, comparator U1 senses when current source I4 is not needed and opens switch S2, deselecting current source I4. However, when input FWR_OUT exceeds input AGC_DAC, a higher discharge rate is desired, and comparator U1 automatically senses the condition and closes switch S2, thereby coupling current source I4 to output AGCOUT and enhancing the discharge rate.

The alternate embodiment of FIG. 3 provides a self-timing feature. While input FWR_OUT remains below input AGC_DAC, comparator U1 does not assert the reset input of flip-flop U2. When input FDC is asserted, it clocks the high level represented by voltage node VCC through flip-flop U2 so that the Q output of flip-flop U2 goes logically high. Since the Q output is coupled to the first input of AND gate U3, the first input of AND gate U3 is held high. Since the input FDC itself, which is high, is coupled to the second input of AND gate U3, the second input of AND gate U3 is also high. Since both inputs of AND gate U3 are high, the output of AND gate U3 is also high. The output of AND gate U3 is coupled to the control terminal of switch S1, so switch S1 closes and couples current source I2 to output AGCOUT.

If input FDC is deasserted, the second input of AND gate U3 is brought low, causing the output of AND gate U3 to go low, opening switch S1 and decoupling current source I2 from output AGCOUT. However, if input FWR_OUT exceeds input AGC_DAC, comparator U1 changes state, producing a rising edge at its output and at the reset input of flip-flop U2 that asserts the reset input of flip-flop U2 and causes output Q to go low. Since flip-flop output Q is coupled to the first input of AND gate U3, a low output Q results in a low AND gate input, causing the output of AND gate U3 to go low and opening switch S1, thereby decoupling current source I2 from output AGCOUT. Thus, current source I2 will be enabled upon the assertion of input FDC and will be disabled when the first of the following two events occurs: (1) input FDC is deasserted, or (2) input FWR_OUT exceeds input AGC_DAC.

By automatically disabling current source I2 when input FWR_OUT exceeds AGC_DAC, output AGCOUT is prevented from exceeding its desired value even if input FDC is left in an asserted state too long. Unlike the prior art, which provides no feedback and requires the rapid gain increasing current source to be turned on for a sufficient time to achieve the maximum possible gain change, the alternate embodiment of the present invention provides feedback through comparator U1, flip-flop U2 and AND gate U3 and automatically controls the duration of activation of current source I2. The embodiment of FIG. 3 uses comparator U1 for a dual role. Comparator U1 provide control of both current source I2 and current source I4. By making the charge pump more automatic, the microprocessor or other control apparatus that generates the FDC input is freed from monitoring the charge pump after asserting the FDC input and may be used to perform other tasks. Because of the less stringent control requirements of the control apparatus, systems incorporating the charge pump may be designed more easily and more reliable and faster charge pump performance may be achieved.

It is preferable to set comparator U1 to switch when the voltage at input FWR_OUT exceeds 125% of the voltage at input AGC_DAC. By allowing input FWR_OUT to exceed input AGC_DAC by less than 25%, use of current source I4 for minor amplitude variations can be avoided, thus lowering power consumption and preventing unnecessarily abrupt gain changes. The circuit of FIG. 3 allows more rapid gain increase because the comparator senses when the gain has increased to give 125% of the required signal and turns off current source I2. Current source I3 then reduces gain to rapidly and efficiently provide a 100% signal level (i.e. an output signal of the ideal amplitude). Thus, while minimizing current drain, the present invention also provides rapid and efficient gain increases when needed.

Although the present invention has been shown with only current sources I2 and I4 switchable, the present invention may also be practiced with more than two current sources switchable. Some or all current sources may be switched off when not needed, thus reducing power consumption. Also, although the alternate embodiment has been shown as using current source I2 to increase the gain of the AGC amplifier to provide a signal having 125% of the desired level, current source I2 need not increase the gain to provide a signal of precisely 125%. Current source I2 may be used to increase the gain to provide a signal having a level less than, greater than or equal to 125% of the desired level.

Thus, a dual mode charge pump for an AGC circuit that overcomes the disadvantages of the prior art has been provided.

We claim:

1. A charge pump for an automatic gain control circuit comprising:
   a deslectable current source for providing an interruptable current flow;
   a comparison means coupled to said deselectable current source for comparison a first signal to a second signal and for selecting and deselecting said deselectable current source, said comparison means selecting said deselectable current source when said first signal exceeds a known percentage of said second signal, said first signal comprising a rectified AC signal.

2. The charge pump of claim 1 wherein said first signal is an input signal representative of an amplitude of an output of said automatic gain control circuit.

3. The charge pump of claim 2 wherein said second signal is an reference voltage signal.

4. The charge pump of claim wherein said known percentage is 125%, said comparison means selects said deselectable current source when said first signal exceeds approximately 125% of said second signal.

5. The charge pump of claim 1 wherein said deselectable current source comprises:
   a current source for providing a current flow and
   a switch coupled to said current source for conducting and interrupting said current flow.

6. The charge pump of claim 5 wherein said switch is coupled to and controlled by said comparison means.

7. The charge pump of claim 1 wherein said deselectable current source comprises:
   a field effect transistor comprising a gate, said gate coupled to said comparison means.

8. A method for controlling the flow of current in a charge pump comprising the steps of:
   comparing an input signal to a reference signal;
   deselecting a current source until said input signal exceeds a predetermined percentage of said reference signal to prevent selecting said current source in response to variations between said input signal and said reference signal when said input signal is less than said predetermined percentage of said reference signal, wherein said input signal comprises a rectified AC signal.

9. The method of claim 8 wherein said predetermined percentage is approximately 125%.

10. A charge pump for an automatic gain control circuit comprising:
    a first deselectable current source for providing a first interruptable current flow;
    a comparison means coupled to said first deselectable current source for comparing a first signal to a second signal and for selecting and deselecting said first deselectable current source;
    a flip-flop coupled to a control input and to said comparison means for producing a first output;
    a logic gate coupled to said first output and to said control input for producing a second output;
    a second deselectable current source coupled to said second output for providing a second interruptable current flow.

11. The charge pump of claim 10 wherein said logic gate is an AND gate.

12. The charge pump of claim 10 wherein said comparison means is coupled to a reset input of said flip-flop and said control input is coupled to a clock input of said flip-flop.

13. The charge pump of claim 12 wherein a data input of said flip-flop is coupled to a constant logic level voltage source.

14. A charge pump comprising:
    a deselectable current source for providing an interruptable current flow;
    comparison means coupled to said deselectable current source for comparing a first signal to a second signal and for selecting and deselecting said deselectable current source;
    a non-selectable current source coupled in parallel with said deselectable current source, said non-selectable current source for providing an uninterrupted current flow.

15. The charge pump of claim 14 wherein said first signal comprises an AC AGC amplitude signal.

16. The charge pump of claim 15 wherein said second signal comprises a reference voltage signal.

17. The charge pump of claim 16 wherein said comparison means selects said deselectable current source when said first signal exceeds said second signal by a predetermined percentage.

18. The charge pump of claim 14 wherein said non-selectable current source has a lower current value than said deselectable current source.

19. The charge pump of claim 14 wherein said deselectable current source comprises a field effect transistor, said field effect transistor having a gate coupled to said comparison means.

* * * * *